(12) United States Patent
Handforth et al.

(10) Patent No.: US 6,926,561 B1
(45) Date of Patent: Aug. 9, 2005

(54) INTEGRATED HIGH AND LOW FREQUENCY CONNECTOR ASSEMBLY

(75) Inventors: Martin R. Handforth, Kanata (CA); John J. Stankus, Plano, TX (US)

(73) Assignee: Nortel Networks Ltd, (CA)

( * ) Notice: Subject to any disclaimer, the term of this patent is extended or adjusted under 35 U.S.C. 154(b) by 62 days.

(21) Appl. No.: 10/139,928

(22) Filed: May 7, 2002

Related U.S. Application Data

(60) Provisional application No. 60/324,328, filed on Sep. 24, 2001.

(51) Int. Cl.[7] .................................. H01R 24/00
(52) U.S. Cl. ............................ 439/632; 439/637
(58) Field of Search ................. 439/59–67, 632, 439/637, 951; 174/250, 254, 117, 1

(56) References Cited

U.S. PATENT DOCUMENTS

| | | | | |
|---|---|---|---|---|
| 2,961,629 A | * | 11/1960 | Kamm | 439/61 |
| 3,221,286 A | * | 11/1965 | Fedde | 439/67 |
| 3,601,759 A | * | 8/1971 | Barker | 439/262 |
| 3,601,774 A | * | 8/1971 | Stathos et al. | 439/637 |
| 4,116,516 A | * | 9/1978 | Griffin | 439/67 |
| 4,227,767 A | * | 10/1980 | Mouissie | 439/493 |
| 4,971,575 A | * | 11/1990 | Martellotti | 439/496 |
| 5,219,292 A | * | 6/1993 | Dickirson et al. | 439/67 |
| 5,322,447 A | * | 6/1994 | Okada | 439/79 |
| 5,328,376 A | * | 7/1994 | West | 439/65 |
| 5,373,109 A | * | 12/1994 | Argyrakis et al. | 174/117 FF |
| 5,741,148 A | * | 4/1998 | Biernath | 439/284 |
| 5,895,276 A | * | 4/1999 | Rothenberger | 439/67 |
| 6,000,955 A | * | 12/1999 | Zaderej | 439/79 |
| 6,551,113 B1 | * | 4/2003 | Nishiyama et al. | 439/67 |

* cited by examiner

*Primary Examiner*—Ross Gushi
*Assistant Examiner*—Larisa Tsukerman
(74) *Attorney, Agent, or Firm*—Steubing McGuinness & Manaras LLP

(57) ABSTRACT

A connector assembly includes a substrate assembly and a receptacle. The substrate assembly includes a first substrate layer having a conductive trace that is accessible for direct electrical interconnection with a first conductor associated with another device. A second substrate layer on the assembly includes an electrical contact for electrical interconnection with a second conductor associated with the other device. The electrical contact on the second substrate layer is disposed such that when the substrate assembly is inserted into the receptacle, the electrical contact is electrically connected with the second conductor, a direct electrical interconnection between the conductive trace and the first conductor is maintained. The arrangement is advantageous in that the connector assembly is capable of transmitting low frequency signals through electrical connections that also serve to maintain a high frequency direct electrical interconnection.

5 Claims, 18 Drawing Sheets

INTEGRATED HIGH AND LOW FREQUENCY CONNECTOR ASSEMBLY

CROSS-REFERENCE TO RELATED APPLICATIONS

A claim of priority is made to U.S. Provisional Patent Application No. 60/324,328, entitled "Small Form-Factor Pluggable Connection of High Frequency and Low Frequency Signals between Substrates", by Martin R. Handforth, et al., filed Sep. 24, 2001, which is incorporated by reference.

This patent application may be related to the following commonly-owned United States patent application, which is incorporated in its entirety by reference:

U.S. patent application entitled SIGNAL LAYER INTERCONNECTS, Ser. No. 09/821,722, by Martin R. Handforth et al., filed Mar. 29, 2001.

FIELD OF THE INVENTION

The present invention relates generally to electrical connectors, and more particularly to electrical interconnect technology for providing high and low frequency electrical interconnections.

BACKGROUND OF THE INVENTION

Many signal interconnect applications require the transmission of both high frequency and low frequency signals. It is known in the art to use different types of connectors to transmit high frequency and low frequency signals, however, this disadvantageously contributes to high cost and complexity in module design. It would be desirable to provide an interconnect technology whereby both high frequency and low frequency signals are efficiently transmitted.

SUMMARY OF THE INVENTION

In accordance with the principles of the invention, a substrate assembly is provided which includes a first substrate layer having a conductive trace that is accessible for direct electrical interconnection with a first conductor associated with another device. A second substrate layer on the assembly includes an electrical contact for electrical interconnection with a second conductor associated with the other device. The electrical contact on the second substrate layer is disposed such that when the electrical contact is electrically connected with the second conductor, a direct electrical interconnection between the conductive trace and the first conductor is maintained. The direct electrical interconnection is advantageously employed for the transmission of a high frequency signal, while the electrical contact is conveniently used to transmit a lower frequency signal.

The substrate assembly can further include a third substrate layer having an electrical contact for electrical interconnection with a third conductor associated with the other device. The second and third substrate layers then define a protrusion from the substrate assembly, such that when the electrical contacts are electrically connected with the respective second and third conductors, the connection forms an overlapping joint which serves to maintain the direct electrical connection between the conductive trace and the first conductor.

Alternatively, the substrate assembly may be configured such that the second substrate layer protrudes from the substrate assembly. When the electrical contact is electrically connected with the second conductor, the connection forms an overlapping joint which serves to maintain the direct electrical connection between the conductive trace and the first conductor.

The substrate assembly can also be arranged such that the first substrate layer and the second substrate layer define a protrusion from the substrate assembly. When the electrical contact is electrically connected with the second conductor, the connection causes pressure to be applied between the substrate assembly and the other device which serves to maintain the direct electrical connection between the conductive trace and the first conductor.

According to a further aspect of the invention, a connector assembly is provided. The connector assembly includes a substrate assembly having a first substrate layer with a conductive trace. The conductive trace is accessible for direct electrical interconnection with a first conductor associated with another device. The substrate assembly has a second substrate layer including an electrical contact for electrical interconnection with a second conductor associated with the other device. The connector assembly further includes a receptacle for disposal on the other device. A conductive contacting member is provided, such that when the substrate assembly is inserted into the receptacle, the electrical contact is electrically connected with the second conductor via the contacting member, and the contacting member serves to maintain a direct electrical interconnection between the conductive trace and the first conductor. The contacting member may be located on the substrate assembly or on the receptacle.

Further provided in accordance with the invention is a connector assembly which includes a substrate assembly and a receptacle. The substrate assembly includes a first substrate layer having a conductive trace that is accessible for direct electrical interconnection with a first conductor associated with another device. The substrate assembly further includes a second substrate layer having an electrical contact for electrical interconnection with a second conductor associated with the other device. The receptacle is for disposal on the other device. The electrical contact on the second substrate layer is disposed such that when the substrate assembly is inserted into the receptacle, the electrical contact is electrically connected with the second conductor, and a direct electrical interconnection between the conductive trace and the first conductor is maintained.

A third substrate layer may be provided, including an electrical contact for electrical interconnection with a third conductor associated with the other device. The second and third substrate layers define a protrusion from the substrate assembly, such that when the substrate assembly is inserted into the receptacle, the electrical contacts are electrically connected with the respective second and third conductors, and the connection between the electrical contacts and second and third conductors form an overlapping joint which serves to maintain the direct electrical connection between the conductive trace and the first conductor.

Alternately, the connector assembly may include a substrate assembly wherein the second substrate layer protrudes from the substrate assembly such that when the substrate assembly is inserted into the receptacle, the electrical contact is electrically connected with the second conductor, and the connection between the electrical contact and the second conductor form an overlapping joint which serves to maintain the direct electrical connection between the conductive trace and the first conductor.

According to another alternative, the connector assembly may include a substrate assembly wherein the first substrate layer and the second substrate layer define a protrusion from the substrate assembly such that when the substrate assembly is inserted into the receptacle, the electrical contact is electrically connected with the second conductor, and pressure is applied between the substrate assembly and the receptacle which serves to maintain the direct electrical connection between the conductive trace and the first conductor.

The various aspects of the invention are advantageous in that a connector assembly is provided that is capable of transmitting low frequency signals through electrical connections that also serve to maintain a high frequency direct electrical interconnection.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENTS

Co-pending patent application Ser. No. 09/821,722, incorporated by reference herein, describes an interconnect technology that is advantageously used for the transmission of high frequency electrical signals. High frequency signal traces are exposed on their respective substrates, and a direct electrical connection is provided when the traces are placed in direct contact with one another. Various problems associated with known interconnect technologies, such as impedance mismatches and cross-talk, are thereby minimized.

Figure 1:
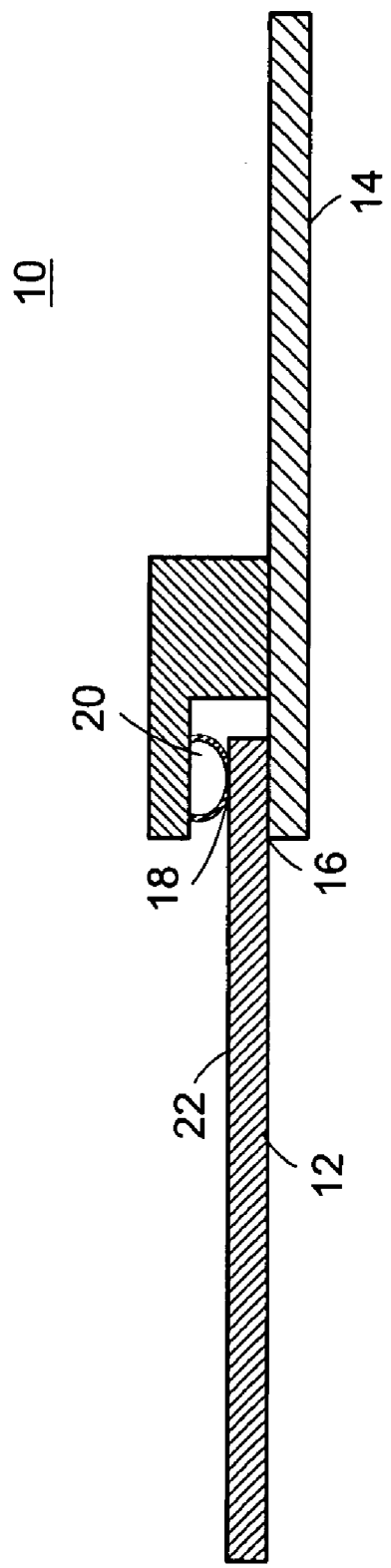
FIG. 1 is a side view of a connector assembly providing a high frequency direct electrical interconnection and a low frequency electrical interconnection in accordance with the present invention.

Referring to FIG. 1, there is shown a preferred embodiment of a connector assembly 10 with direct signal layer interconnect capability. The connector assembly 10 is shown to include a substrate assembly 12 and receptacle 14. Note that in FIG. 1, only an side view of one wall of the receptacle is shown. The substrate assembly 12 is shown disposed within the receptacle 14 such that a high frequency direct electrical connection is maintained at interface 16. Exposed signal traces on the substrate assembly 12 are brought into direct electrical contact with exposed signal traces on the receptacle 14 at the interface 16, thus providing a reliable high frequency connection. At the interface 18, an electrical connection is made between a conductive contacting member 20 and electrical contacts on the surface 22 of the substrate assembly 12. The conductive contacting member 20 provides an electrical connection between the electrical contacts on the surface 22 and corresponding electrical contacts on the receptacle 14. The conductive contacting member 20 also serves to maintain the high frequency direct electrical connection at the interface 16 due, in this example, to the pressure that is provided by the contacting member 20 against the substrate assembly 12.

Figure 2:
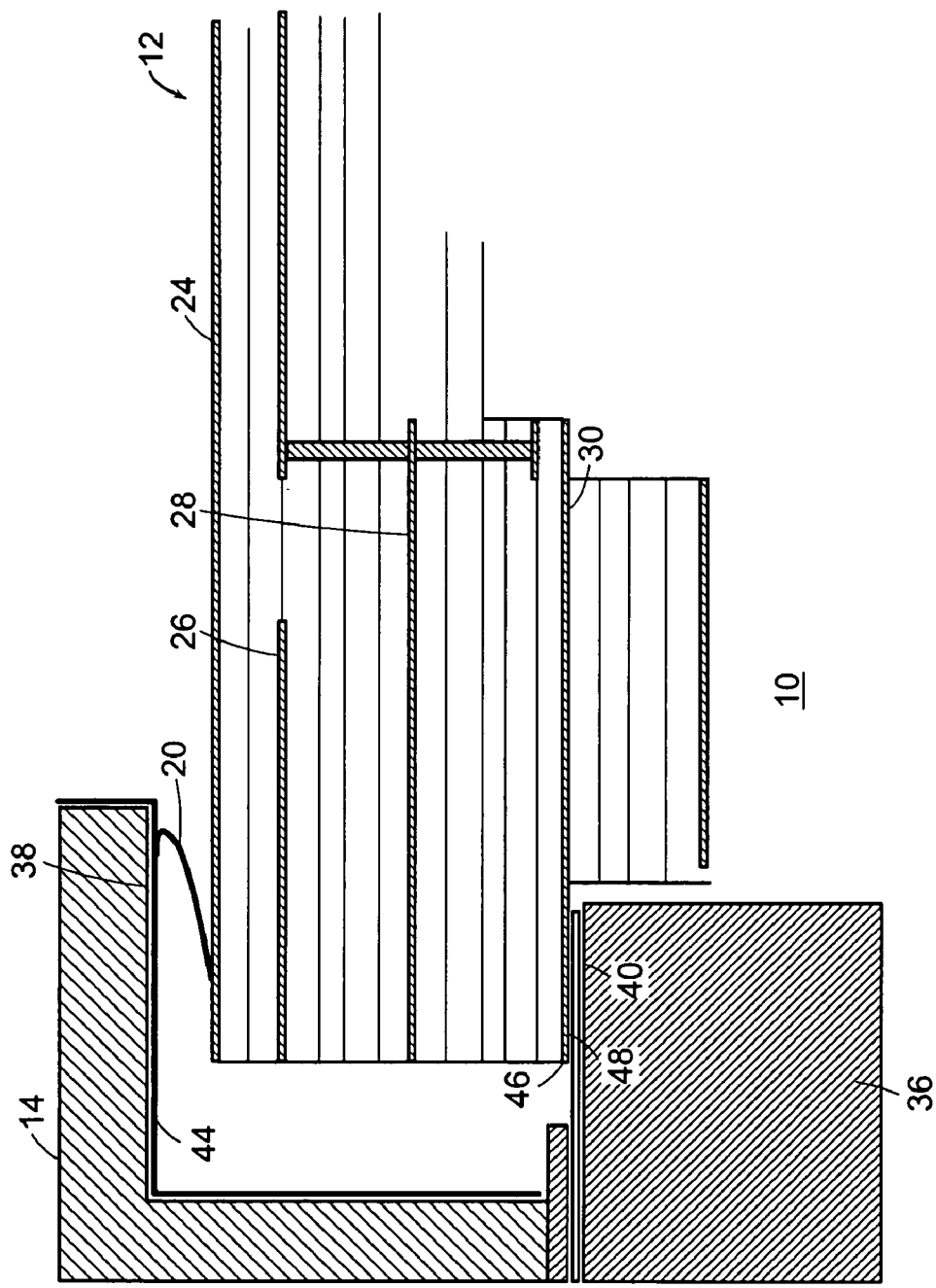
FIG. 2 is a side view of a preferred embodiment of the connector assembly of FIG. 1.
Figure 4:
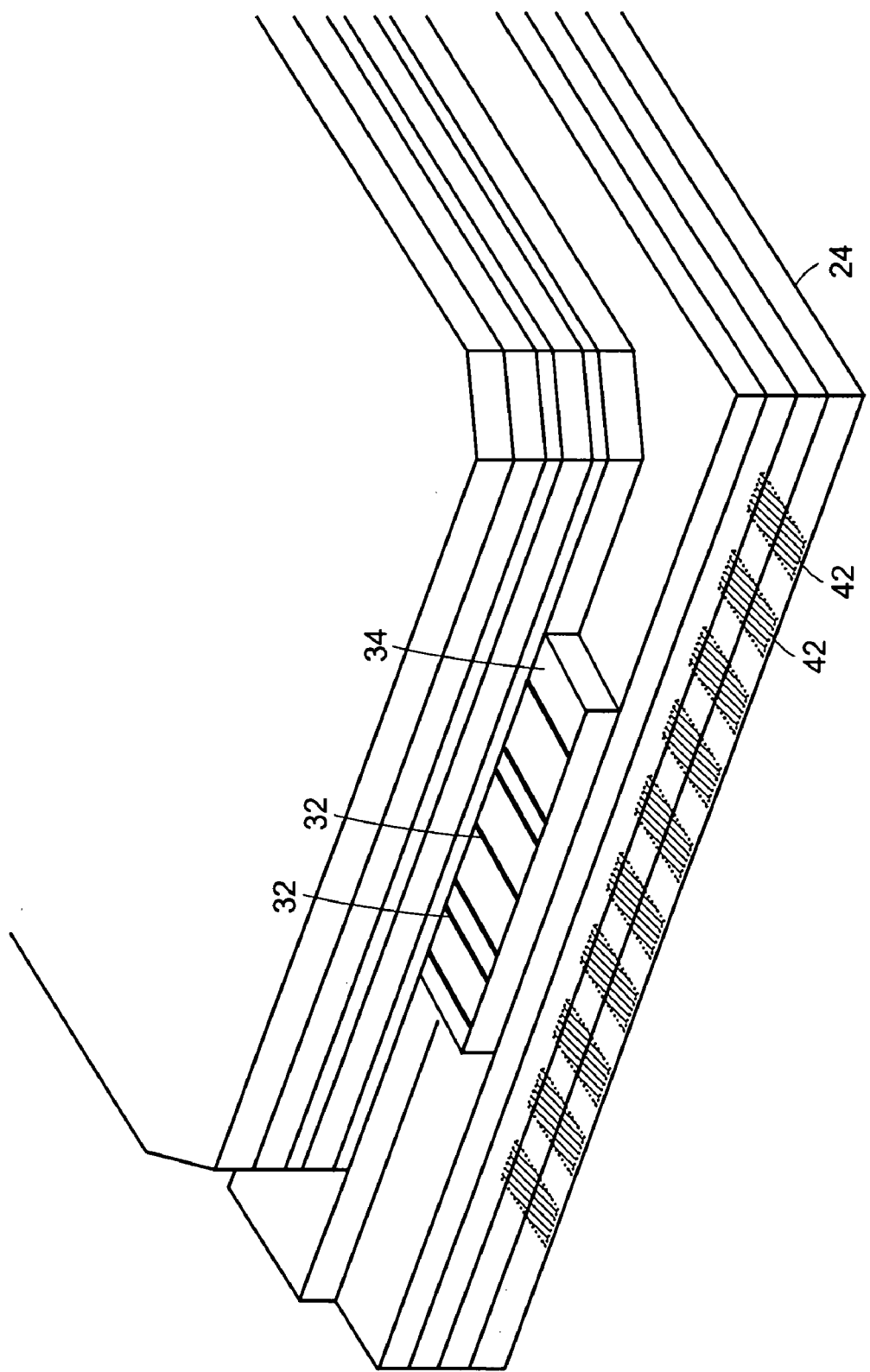
FIG. 4 is a perspective view of the substrate assembly of FIG. 2.

The preferred embodiment is shown in more detail in FIG. 2. The substrate assembly 12 has multiple layers, including outer layer 24 and inner layers 26, 28, and 30. Each layer includes a dielectric portion and a conductive portion. For example, layer 30 includes substantially flat conductive traces 32 (shown in FIG. 4) disposed on dielectric substrate material 34, such as FR4, ceramic, or other materials. Each inner layer is generally dedicated to a single function, such as carrying ground, power or signals. The receptacle 14 also includes a substrate material 36, such as FR4, ceramic, or other materials. The receptacle 14 further includes electrical conductors 38 and 40 through which low frequency electrical connections and high frequency electrical connections will respectively be made.

Portions of selected signal layer traces 32 are made directly accessible in order to facilitate electrical connection. As shown for instance in FIG. 4, one end of substrate material 34 containing some of the signal layer traces 32 is exposed so that traces 32 are accessible for direct electrical connection with corresponding exposed conductors 40 on the receptacle. The direct electrical connection between the traces 32 and the conductors 40 is particularly advantageous for the transmission of high frequency signals as described in the co-pending patent application Ser. No. 09/821,722.

The outer layer 24 on the substrate assembly 12 includes electrical contacts 42 (FIG. 4) for the transmission of low frequency signals such as power, ground, or certain control signals. The conductive contacting member 20 contacts the electrical contacts 42 to establish an electrical connection between the electrical contacts 42 and corresponding low frequency conductors 38 on the receptacle 14. The contacting member 20 may be for example a leaf spring, a coil spring, a bending beam, or a ball contact, and may be attached either to the surface 44 of the receptacle 14 (as shown) or to the top of the outer layer 24 of the substrate assembly 12. The contacting member 20 conveniently serves to maintain the high frequency electrical interconnection 46 at interface 48 in this particular embodiment due to the pressure provided between the substrate assembly 12 and the receptacle 14. The pressure in this embodiment is due to the spring force between the conductors 38 of the receptacle and the electrical contacts 42 of the substrate assembly 12 provided by the contacting member 20. Alternatively, the contacting member may be an inflexible member like a ball contact, in which case the pressure provided between the substrate assembly 12 and the receptacle 14 could be provided by a flexible member located in another place.

Figure 3:
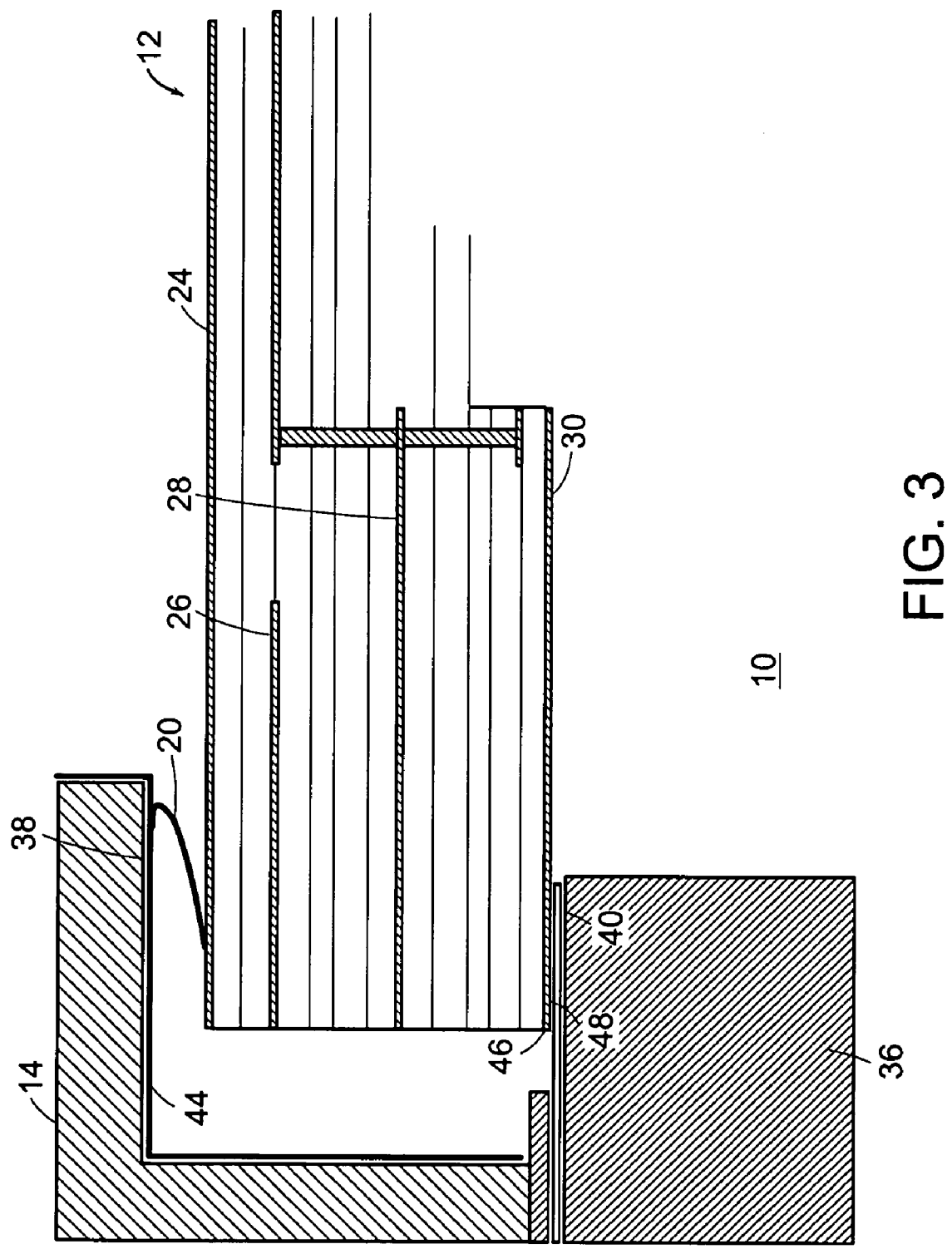
FIG. 3 is a side view of an alternate version of the preferred embodiment of the connector assembly shown in FIG. 2.

In FIG. 3 there is shown an alternate embodiment of the connector assembly 10 of FIG. 2. This embodiment does not include substrate layers below the layer 30.

Figure 5:
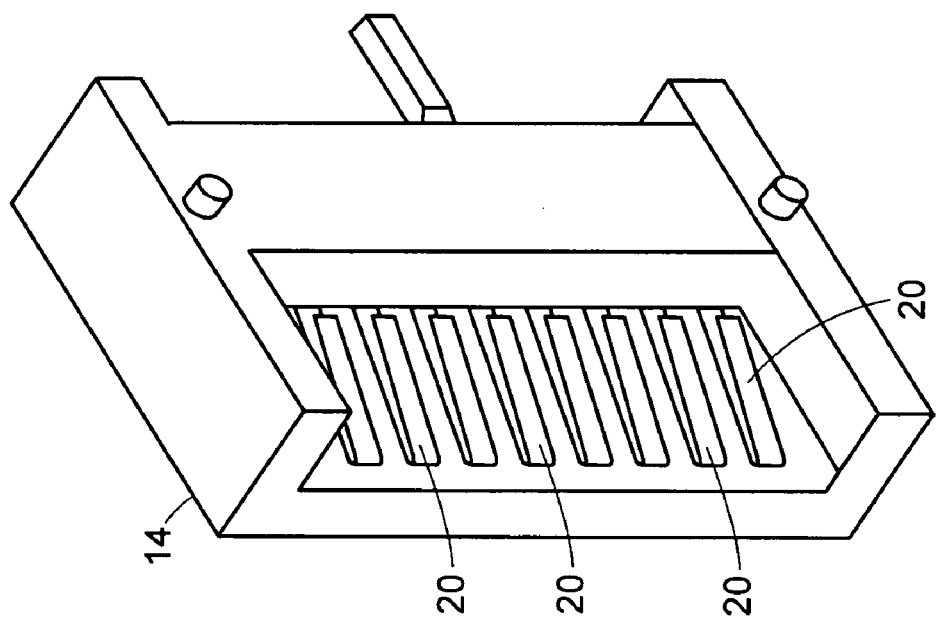
FIG. 5 is a perspective view of the receptacle portion of the connector assembly shown in FIG. 2.

In FIG. 5 there is shown a perspective view of the receptacle 14, showing the contacting member 20 as a series of leaf springs. This receptacle 14 is placed on a substrate 36, and the high frequency interconnection is made between signal traces on a substrate assembly 12 and signal traces on the substrate 36. The high frequency interconnection would be maintained via the spring force provided by the leaf spring contacting members 20. The leaf spring contacting members 20 are bonded, for example by soldering or welding, to low frequency signal contacts 38. The leaf spring contacting members 20 contact low frequency signal traces 42 on the substrate assembly 12.

Figure 6:
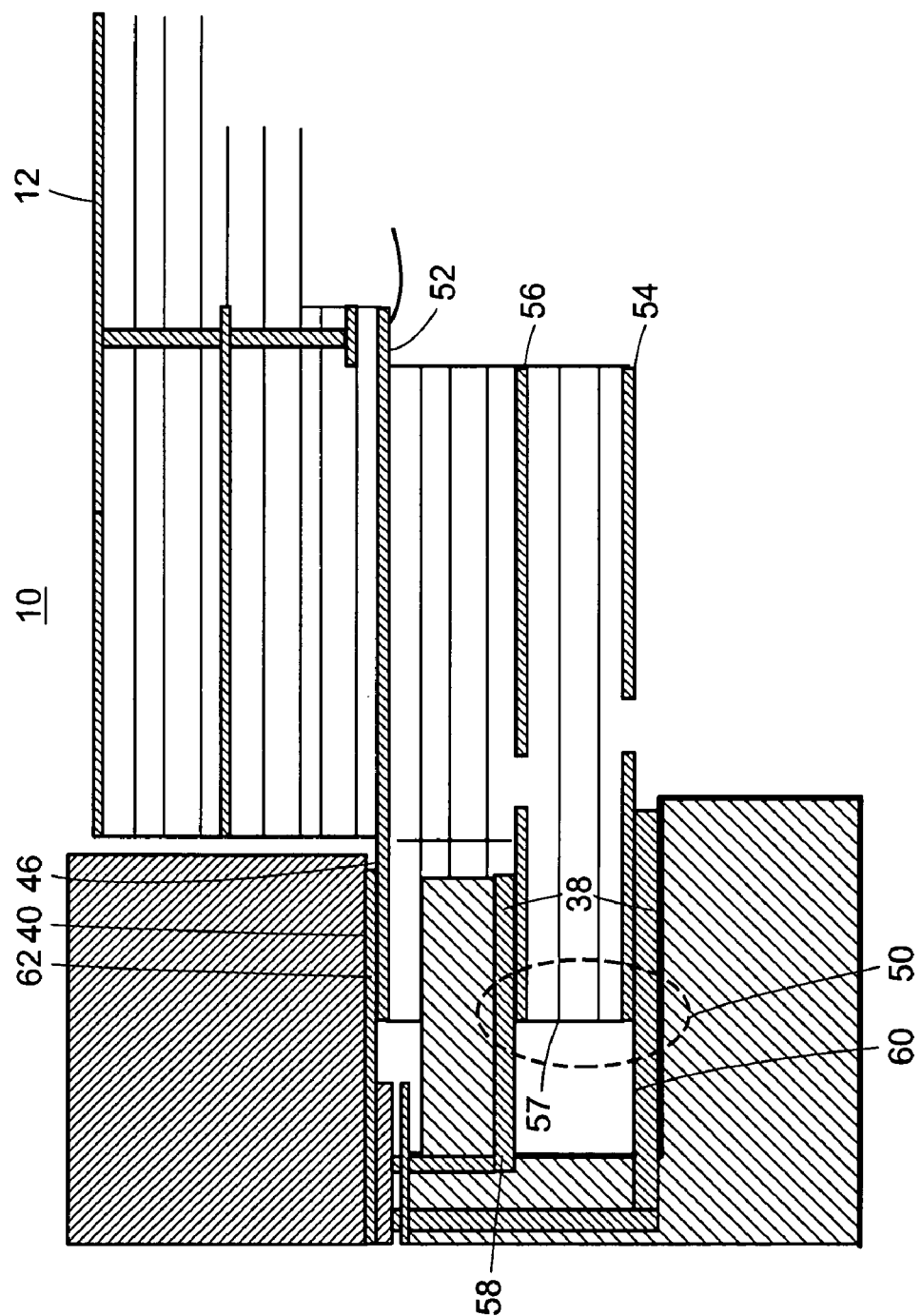
FIG. 6 is a side view of an alternate embodiment of the connector assembly of FIG. 1.
Figure 7:
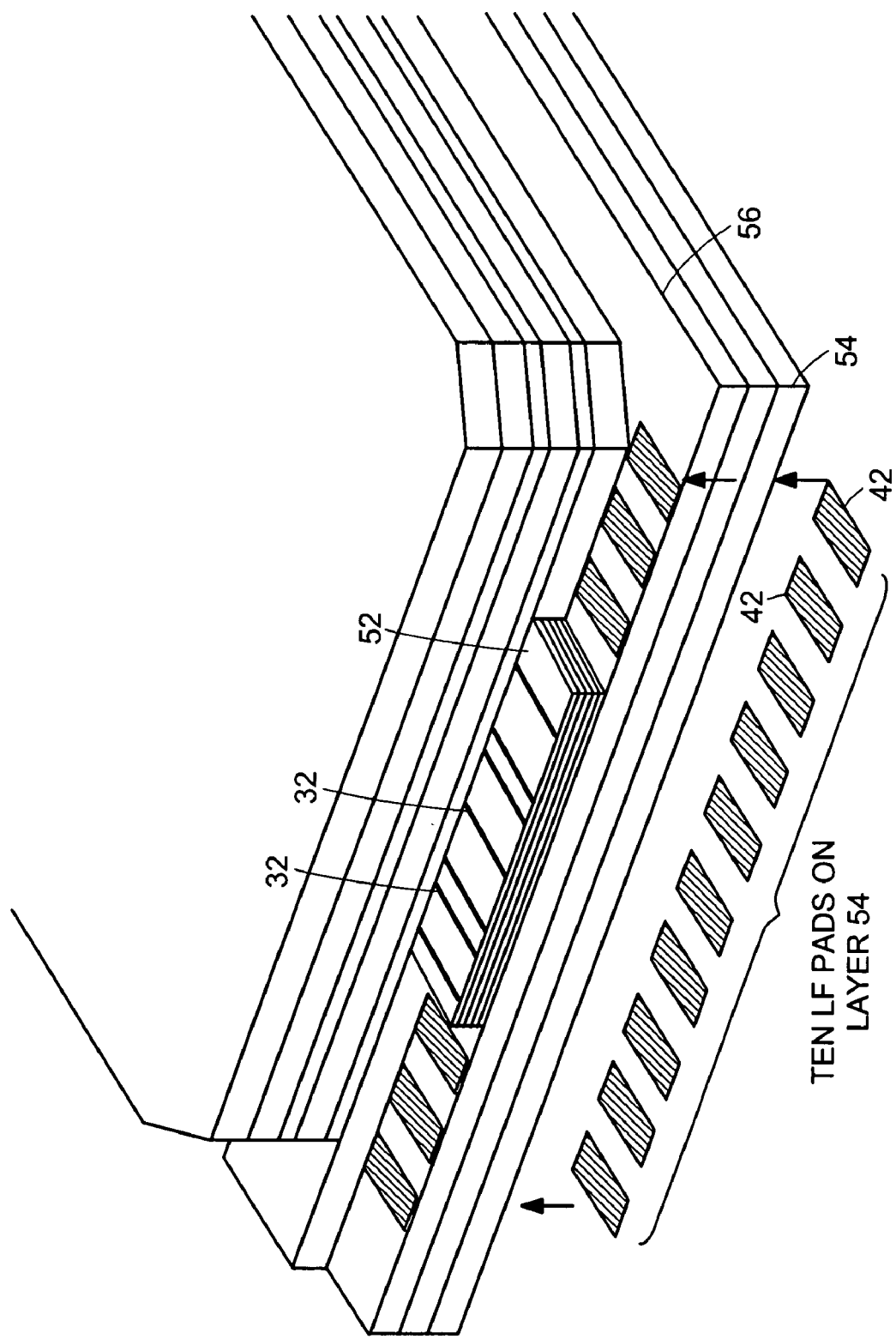
FIG. 7 is a perspective view of the substrate assembly of FIG. 6.

In an alternate embodiment as shown in FIG. 6, the high frequency direct electrical interconnection is maintained via a tunnel joint 50 that conducts low frequency signals between the substrate assembly 12 and the receptacle 14. As further seen in FIG. 7, layer 52 of the substrate assembly 12 includes high frequency signal traces 32, which are exposed for direct electrical interconnection with corresponding conductors on the receptacle 14 when the substrate assembly 12 is inserted into the receptacle 14. The substrate assembly 12 also includes electrical contacts 42 on layers 54 and 56. The substrate layers above layer 56 have been cut away such that the electrical contacts on layer 56 are exposed, and such that the layers 54–56 form a protrusion 57 for insertion between low frequency contact surfaces 58 and 60 disposed on the receptacle 14. When the substrate assembly 12 is inserted into the receptacle 14, the electrical contacts 42 on layer 54 of the substrate assembly 12 electrically contact corresponding low frequency conductors 38 on surface 60 of the receptacle 14 for transmission of low frequency signals between the contacts 42 and the conductors 38, while the electrical contacts on layer 56 of the substrate assembly 12 electrically contact corresponding low frequency conductors 38 on surface 58 of the receptacle 14 for transmission of low frequency signals between the contacts 42 and the conductors 38. The protrusion 57 as inserted between the surfaces 58 and 60 acts as a tunnel joint 50 for securing the substrate assembly 12 within the receptacle 14 and maintaining via pressure the high frequency electrical interconnection 46 between the signal traces 32 and corresponding conductors 40 on receptacle surface 62.

Figure 8:
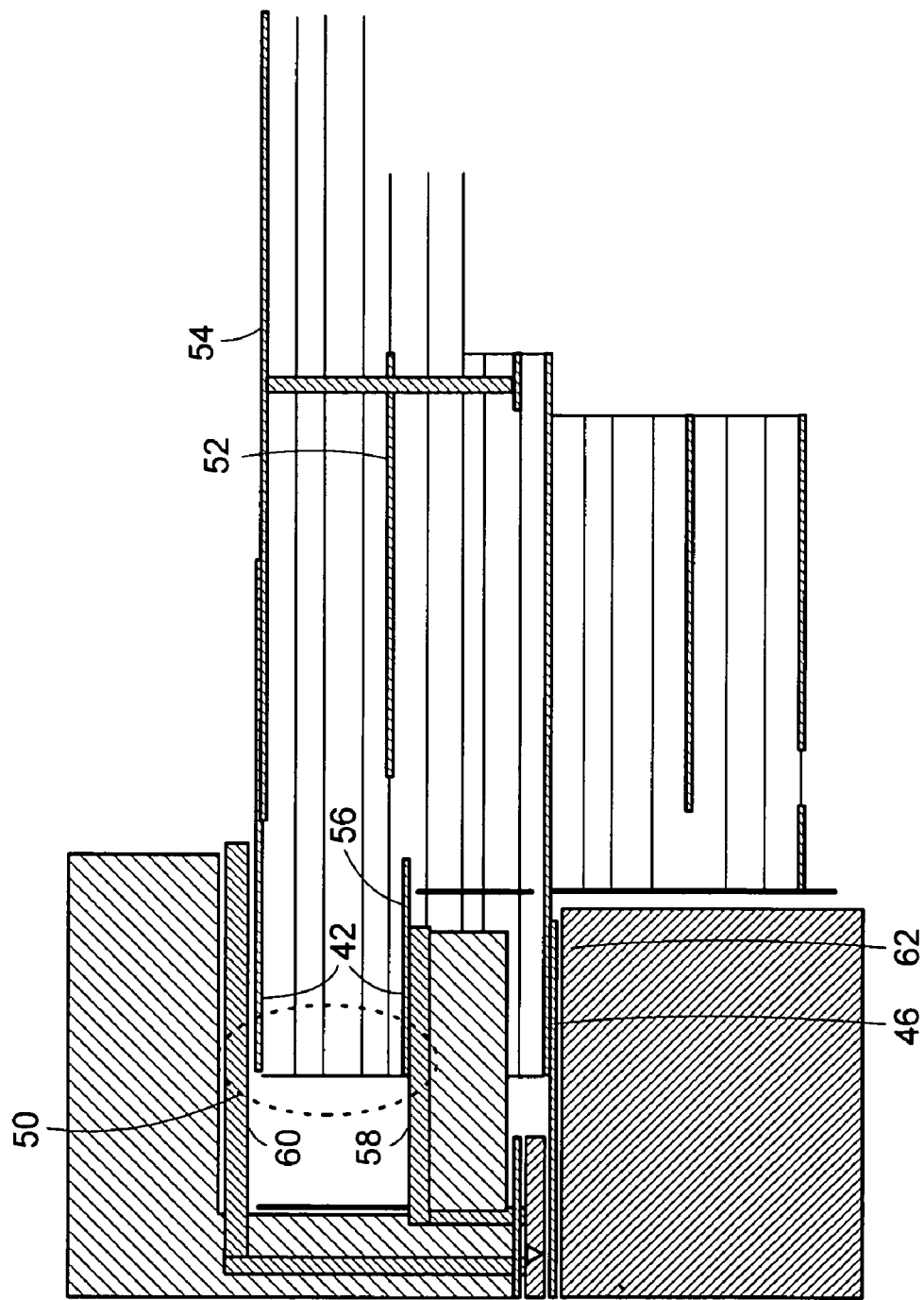
FIG. 8 is a side view of an alternate embodiment of the connector assembly shown in FIG. 1.

According to another embodiment as shown in FIG. 8, the positions of the tunnel joint 50 and low frequency surfaces 58 and 60 are reversed relative to the position of the high frequency interconnection 46 as was shown in FIG. 6. Here, the tunnel joint 50 is positioned above the layer 52 on the substrate assembly 12 upon which the high frequency signal traces 32 are exposed. Electrical contacts 42 on layers 54 and 56 contact low frequency conductors 38 on the receptacle 14 for transmission of low frequency signals between the contacts 42 and the conductors 38. The layers 54–56 are disposed between the surfaces 58 and 60 on receptacle 14 to form the tunnel joint 50 for securing the substrate assembly 12 within the receptacle 14 and maintaining the high frequency electrical interconnection 46 between the signal traces 32 and conductors 40 on the receptacle surface 62.

Figure 9:
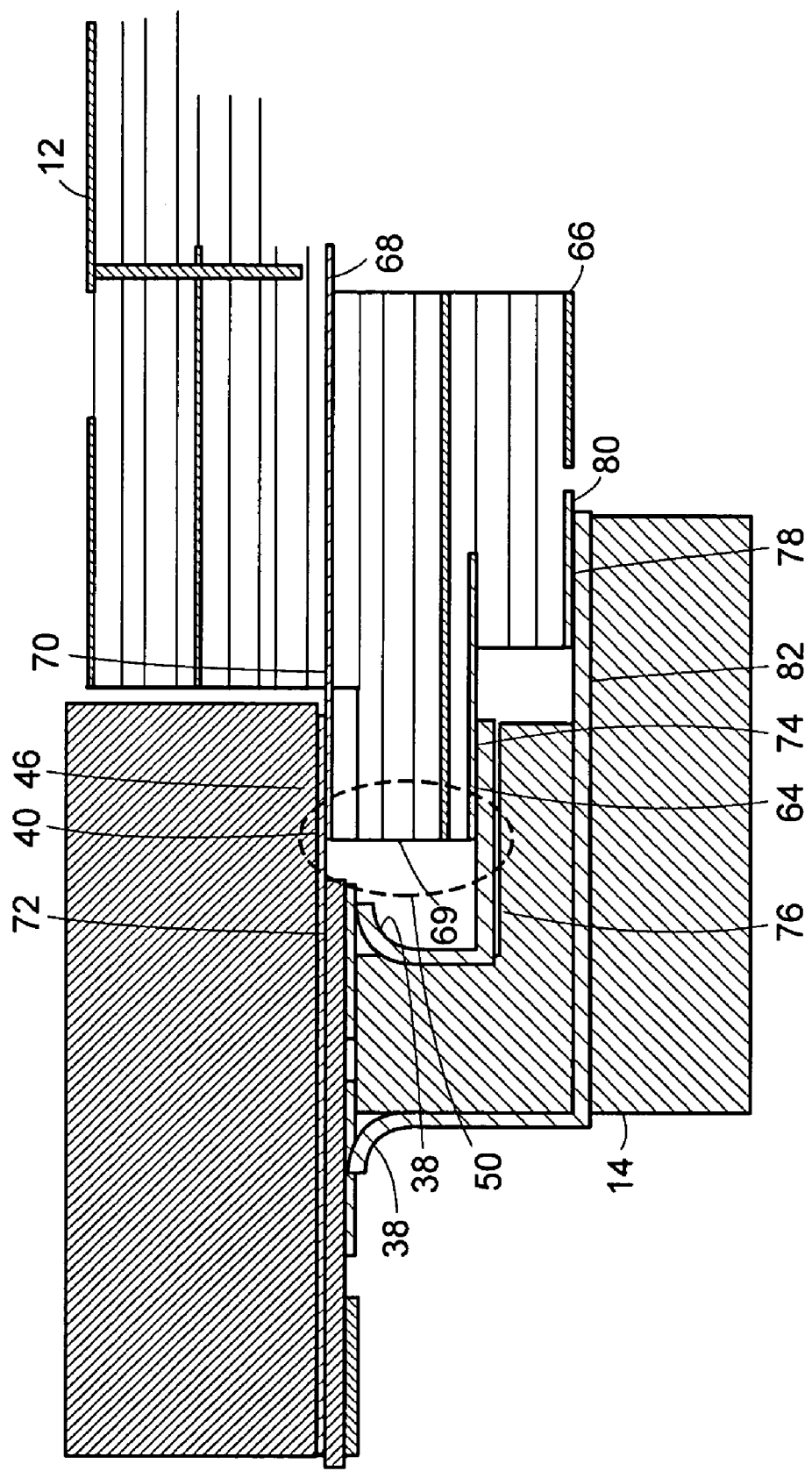
FIG. 9 is a side view of another embodiment of the connector assembly of FIG. 1.
Figure 10:
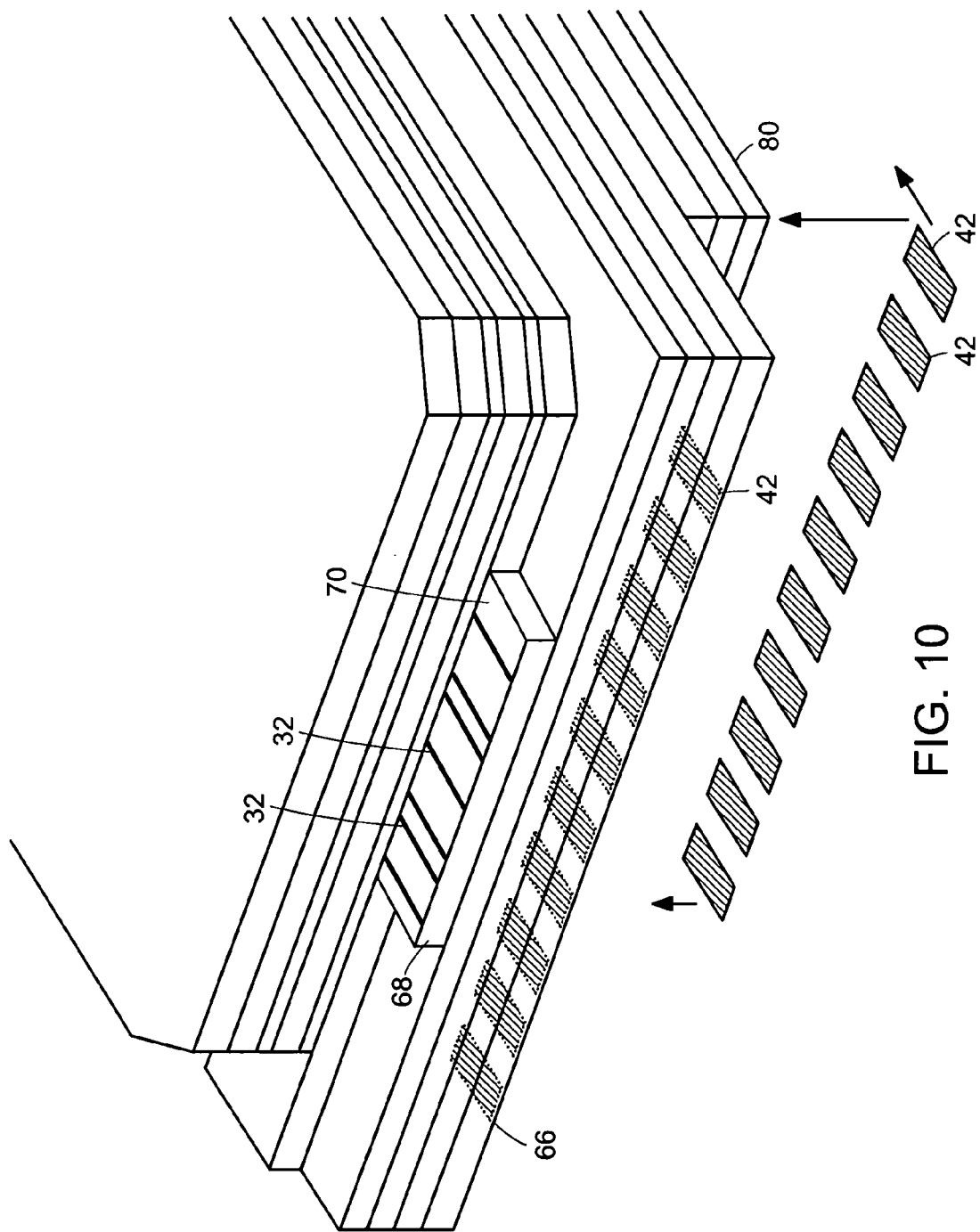
FIG. 10 is a perspective view of the substrate assembly of FIG. 9.

According to another embodiment as shown in FIGS. 9 and 10, the tunnel joint 50 is now disposed between the high frequency interconnection 46 and one of the low frequency connections 64. Layers 66 through 68 of the substrate assembly 12 form a protrusion 69 beyond the other layers of the substrate assembly 12. High frequency signal traces 32 are exposed on the edge 70 of layer 68 for direct interconnection with conductors 40 on the surface 72 of the receptacle 14. Electrical contacts 42 are disposed on the edge 74 of layer 66 for electrical connection with corresponding low frequency conductors 38 on surface 76 on the receptacle 14. Further electrical contacts 42 are disposed on the edge 78 of layer 80 for electrical connection with conductors 38 on surface 82 on the receptacle 14. When the substrate assembly 12 is inserted into the receptacle 14, the protrusion 69 forms a tunnel joint 50 between the high frequency interconnection 46 and the low frequency connection 64. The high frequency direct interconnection 46 is thereby maintained due to the pressure applied by the tunnel joint 50. The "stairstep" nature of the low frequency connections can be advantageous in that several wide track low frequency connections can be provided without requiring an excessively wide form factor.

Figure 11:
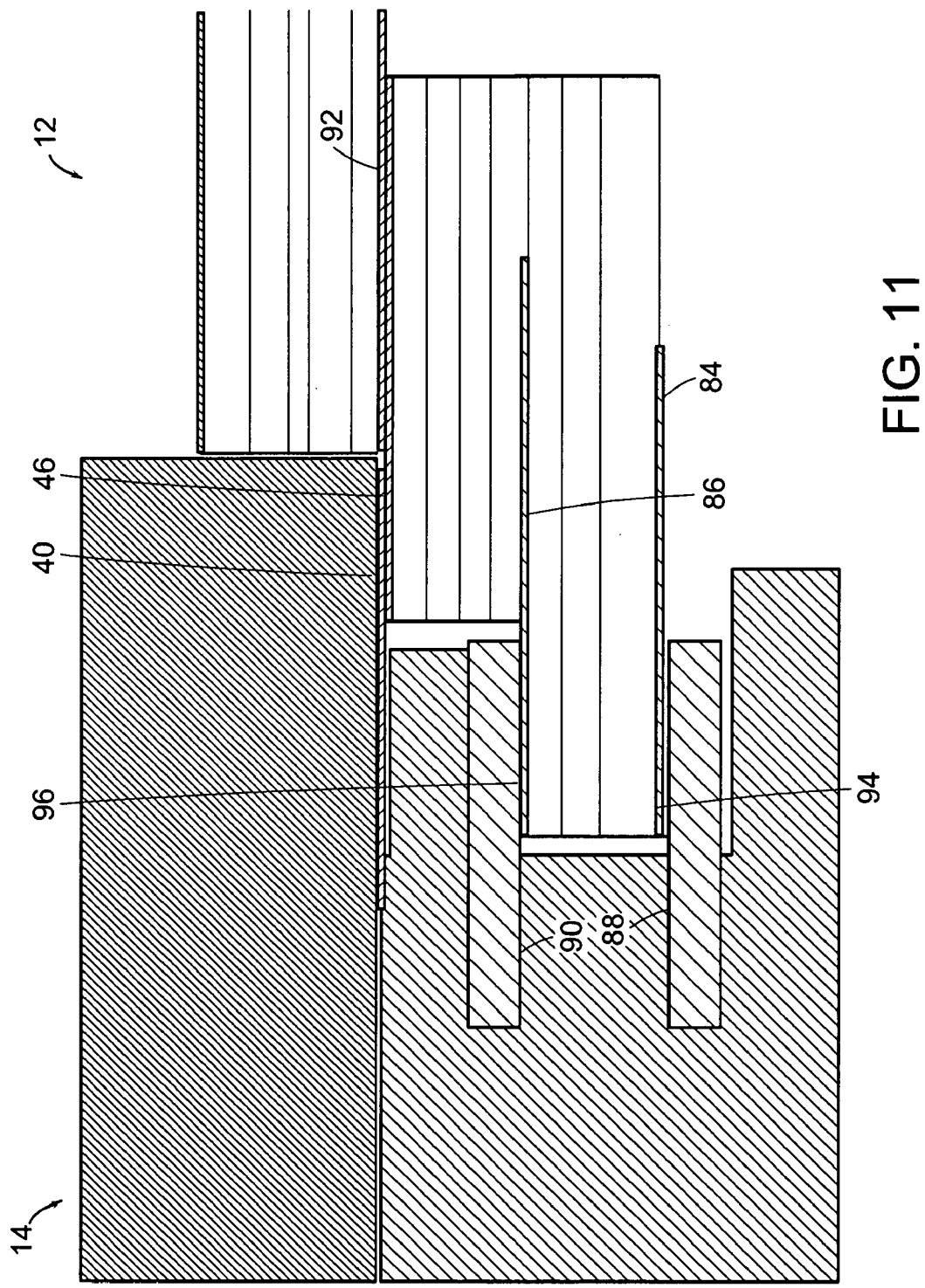
FIG. 11 is a side view of another embodiment of the connector assembly of FIG. 1.
Figure 12:
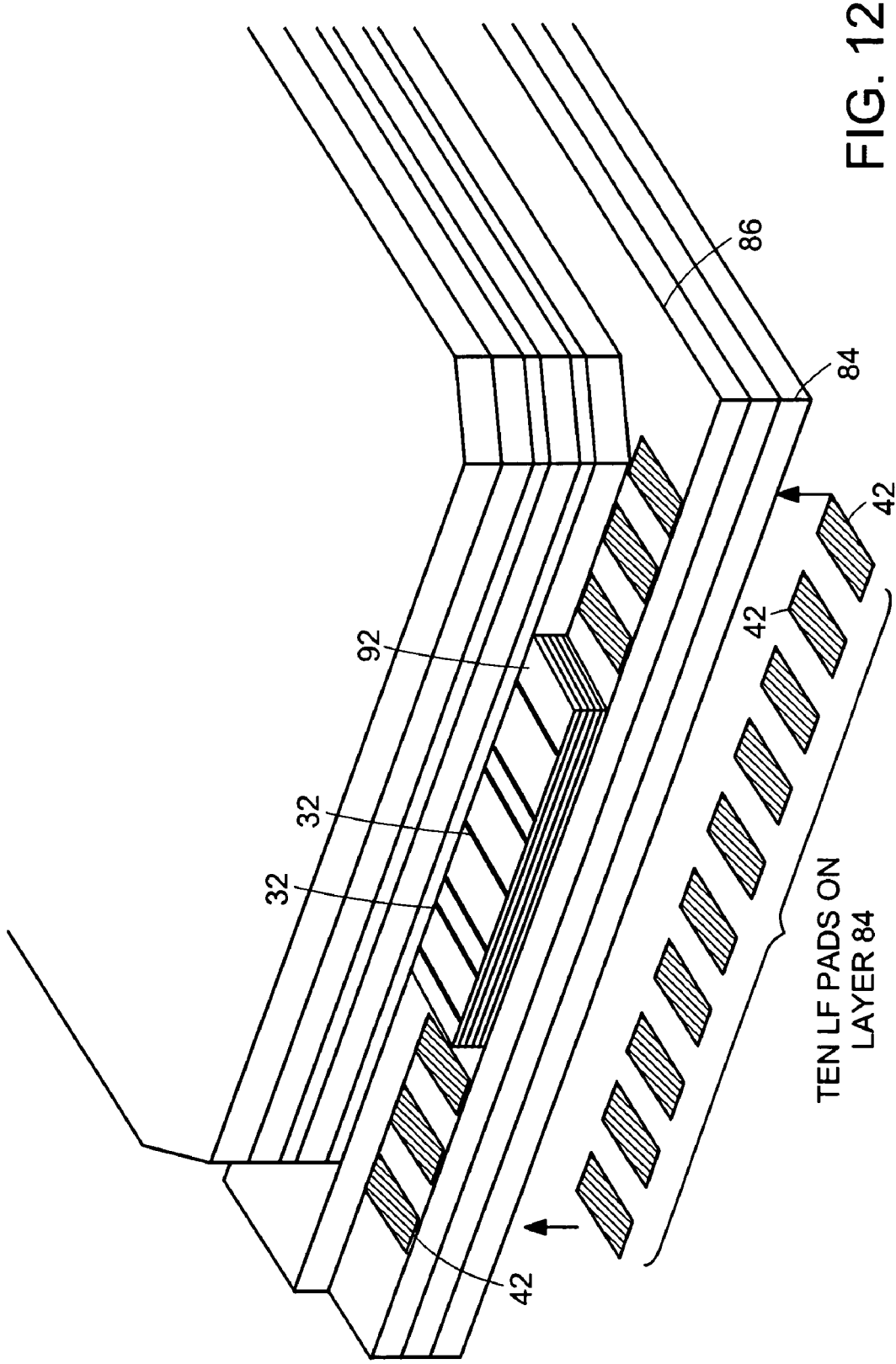
FIG. 12 is a perspective view of the substrate assembly of FIG. 11.

According to the embodiment shown in FIGS. 11 and 12, layers 84 and 86 of the substrate assembly 12 include electrical contacts 42 for establishing low frequency connections with corresponding conductors 38 on surfaces 88 and 90 on the receptacle 14. High frequency signal traces 32 are exposed along the edge of Layer 92 of the substrate assembly 12. When substrate assembly 12 is inserted into receptacle 14, the pressure provided between the low frequency interconnections 94 and 96 maintains the high frequency direct interconnection 46. As seen in FIG. 11, a row of low frequency electrical contacts 42 (10 are shown) are disposed along the bottom of layer 84 of the substrate assembly 12, for contact with corresponding conductors 38 on the surface 88 of the receptacle. Further low frequency electrical contacts 42 are disposed on layer 86, for contact with corresponding conductors 38 on the surface 90 of the receptacle. High frequency signal traces 32 are disposed on layer 92 for contact with conductors 40 on the receptacle 14.

In all of the embodiments shown in FIGS. 6–12, it is noted that two different low frequency connection paths are provided. Several different low frequency electrical connections can thereby be advantageously provided while the high frequency direct electrical connection is maintained.

Though the various embodiments described herein are directed to the use of a low frequency interconnection to maintain a high frequency direct electrical interconnection, a skilled artisan will realize that signals of various frequencies may be transmitted via the electrical connections that serve to provide pressure to maintain the high frequency direct electrical connection 46. The frequencies of these signals may vary as long as they are compatible with the properties associated with standard electrical interconnects and with the electrical properties associated with their trace lengths and widths.

Figure 13:
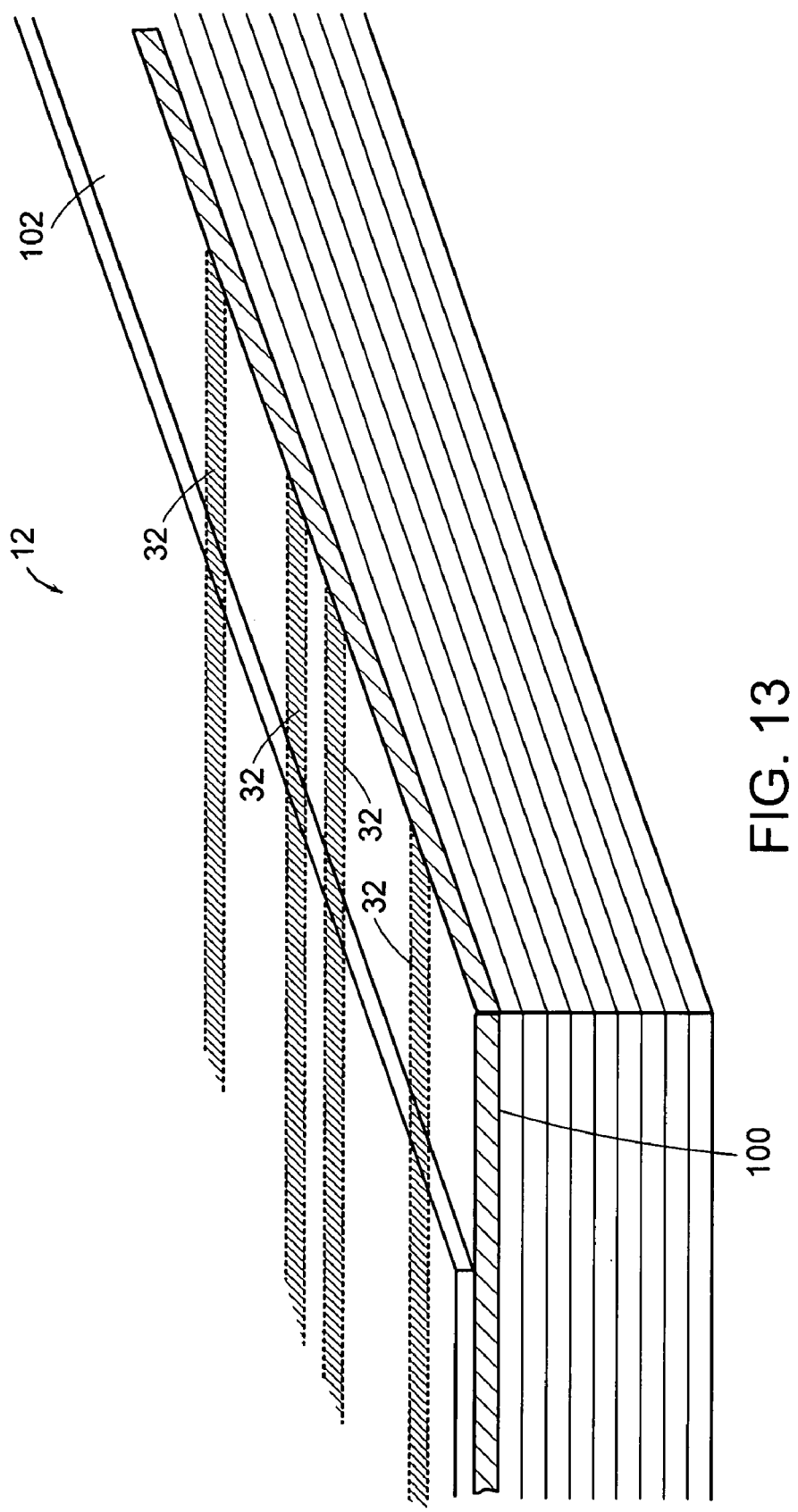
FIG. 13 is a perspective view of a substrate assembly including a compliant layer.

In accordance with further principles of the invention, it has been found convenient to provide some compliance in the substrate upon which the high frequency signal traces 32 are exposed, in order to improve the quality of the direct electrical connection formed by the contact of the exposed signal traces 32 with corresponding conductors 40 on the receptacle 14. In FIG. 13, the substrate assembly 12 is shown to include a layer of polymeric material 100, for example Kapton® polyimide film. The Kapton layer provides flexibility to the layer 102 upon which the exposed traces 32 are disposed, allowing the traces 32 to be positioned with uniform pressure against the corresponding exposed traces 40 on the receptacle when the substrate assembly 12 is inserted into the receptacle 14.

Figure 14:
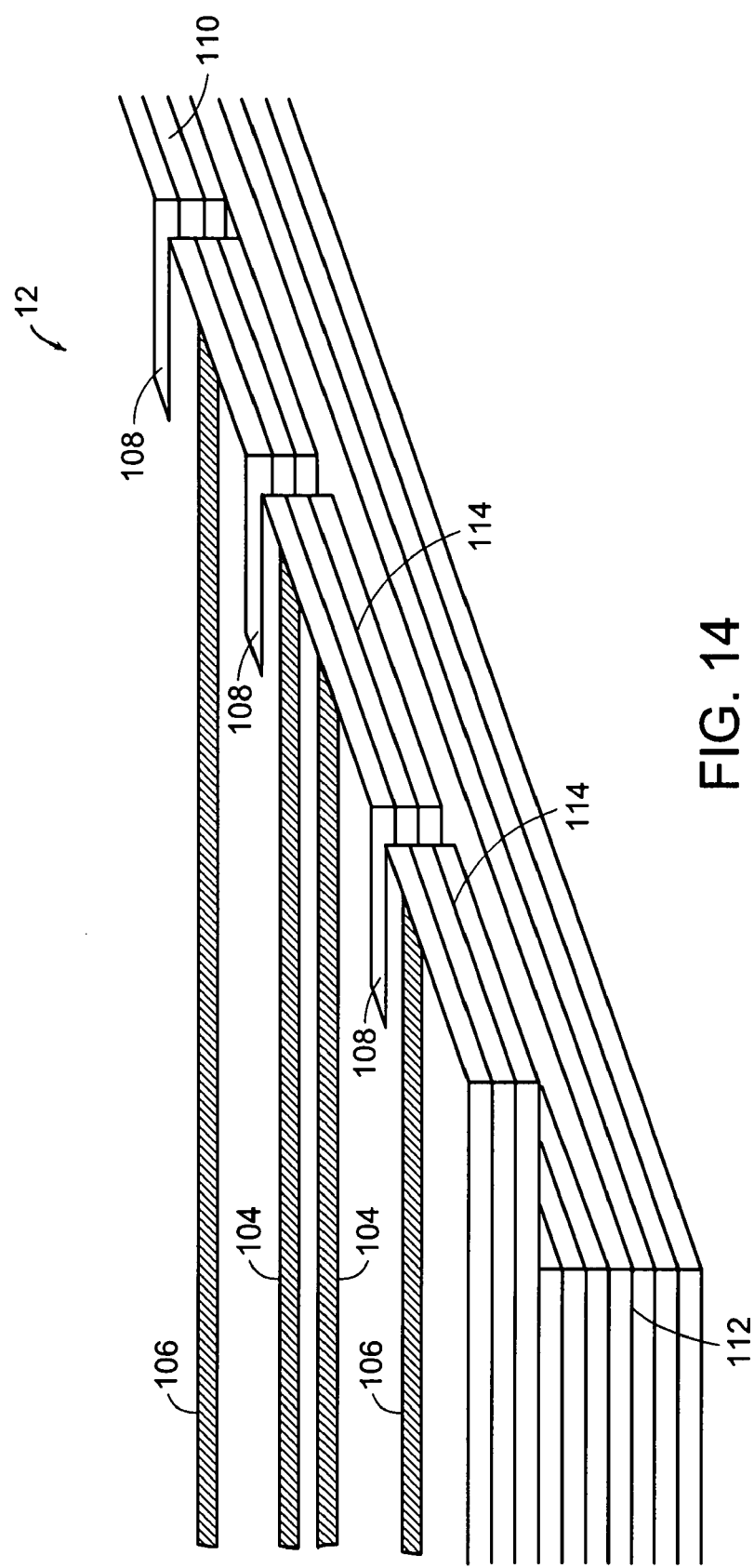
FIG. 14 is a perspective view of a substrate assembly including bending beams supporting high frequency traces.

FIG. 14 shows further mechanisms for improving the quality of the direct electrical connection. The exposed signal traces 32 are here shown to include differential pair 104, and ground traces 106. Longitudinal cuts 108 have been made in the top three substrate layers 110, between the ground traces 106 and differential pair traces 104. The bottom seven substrate layers 112 have been removed below the exposed traces 32. Each ground trace 106 and the differential pair traces 104 are now supported on a bending beam 114. Each ground trace 106 and the differential pair traces 104 can thereby move laterally relative to each other. When the substrate assembly 12 is inserted into the receptacle 14, contact of uniform pressure is made between the exposed traces 32 and corresponding conductors 40 on the receptacle 14 even if there is slight lateral misalignment of any of the exposed traces 32 or 40.

Though the current example shows the exposed traces 32 being supported by three substrate layers, a skilled artisan will realize that any number of substrate layers can provide a reasonably performing bending beam 114.

Figure 15:
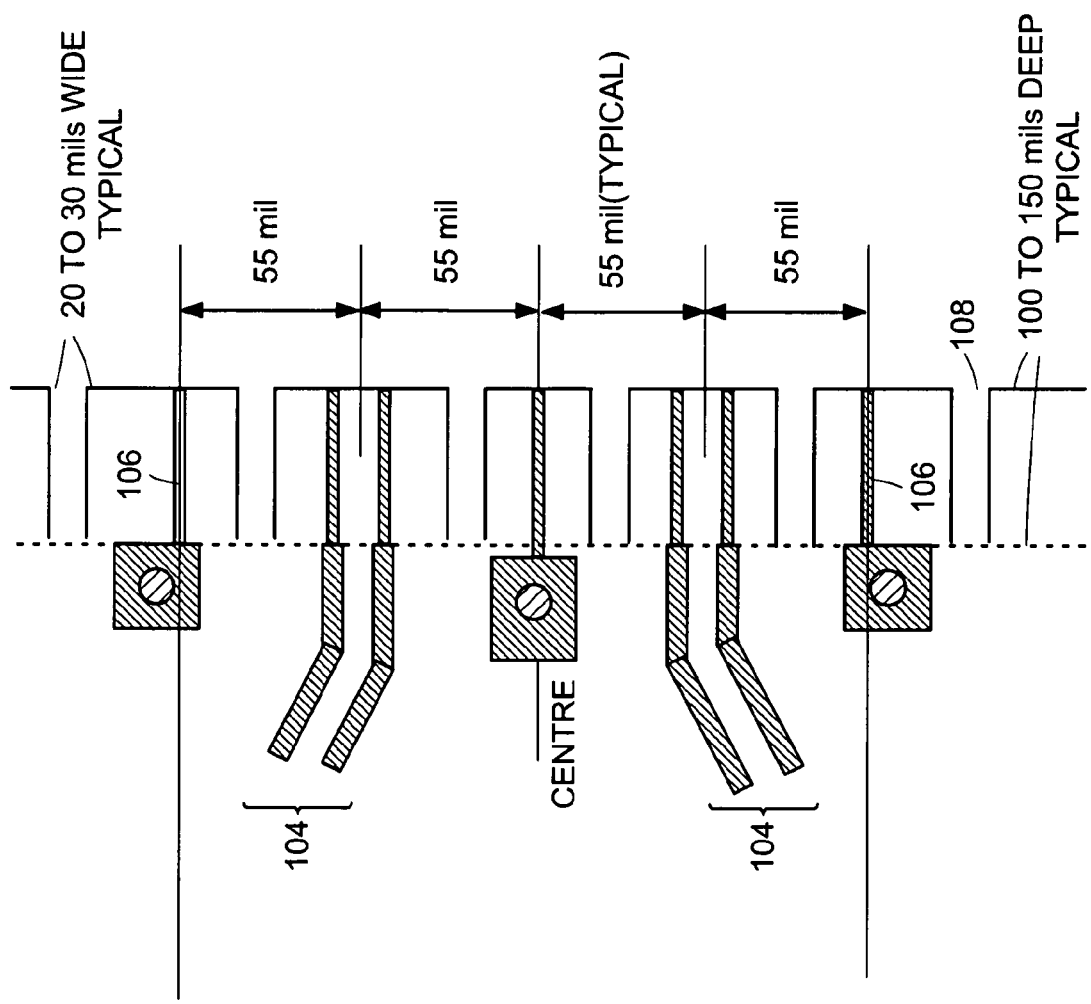
FIG. 15 is an overhead view of the bending beams of FIG. 13.

In FIG. 15 there is shown a top view of the substrate assembly 12 of FIG. 13. In this example, differential signal traces 104 are typically 3 to 8 mils (hundredths of an inch) wide, and spaced about 5 to 8 mils apart. The ground traces 106 are typically 3 to 8 mils wide. The ground traces 106 are typically spaced about 55 mils from the center of the differential traces 104. For these dimensions, well performing bending beams 114 are produced by providing longitudinal cuts 108 that are typically about 20 to 30 mils wide, and about 100 to 150 mils deep. The skilled artisan will of course realize that reasonably performing bending beams 114 may be provided through cuts of different dimensions.

Figure 16:
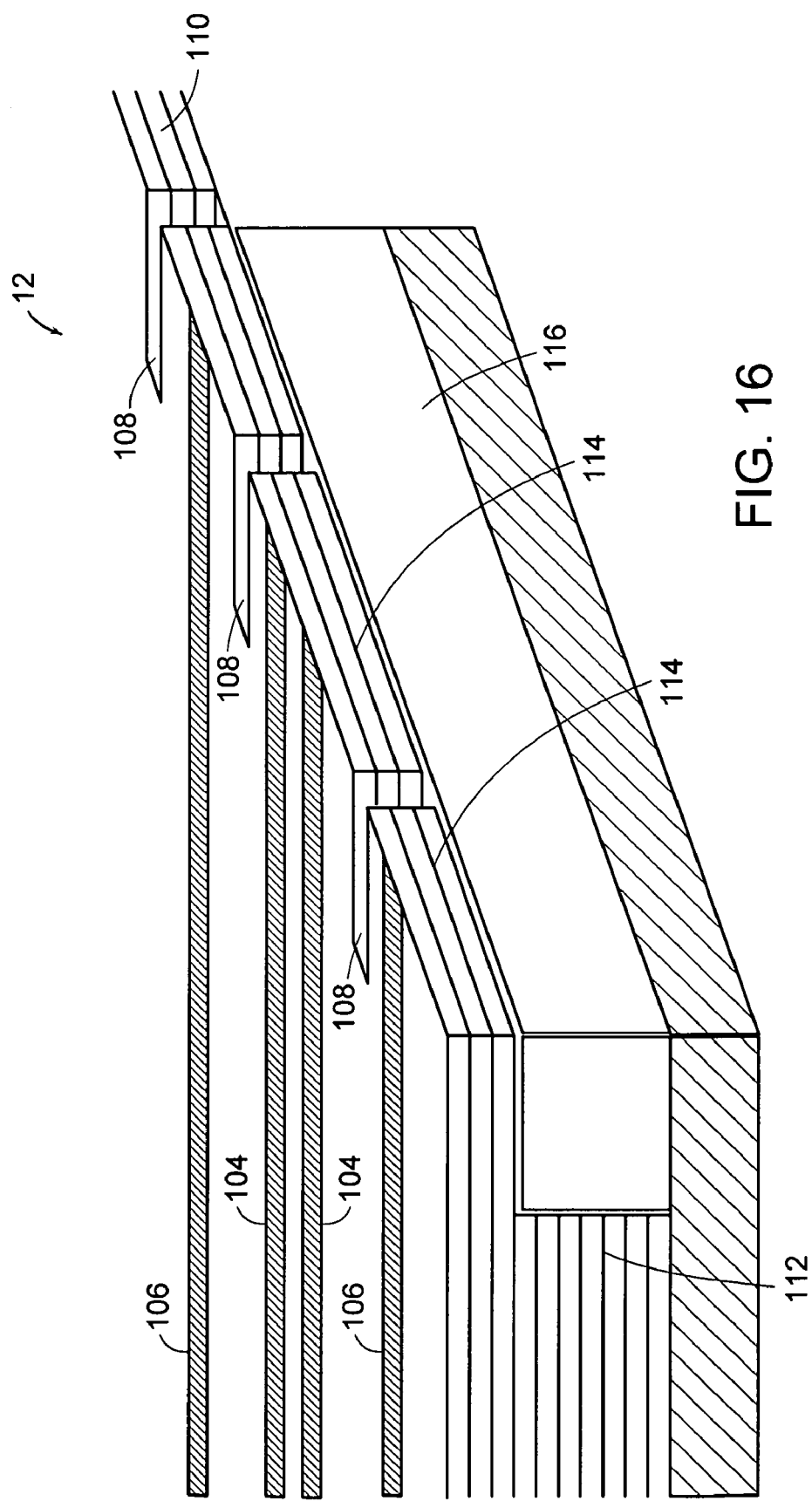
FIG. 16 is a perspective view of the substrate assembly of FIG. 14 including an elastomer material supporting the bending beams.

FIG. 16 shows the addition of an elastomer material 116 below the bending beams 114, disposed within the area from which the substrate section 112 has been removed. The material may be for example one of the following: Poly (ethylene-co-propylene), commonly know as EPR, Poly (tetrafluoroethylene-co-perfluoropropylene), commonly known as Viton A, Poly(butadiene-co-styrene), commonly known as SBR, Poly(butadiene-co-aclonitrile), commonly known as Hycar, Poly(cis-1,4-butadiene), commonly known as Budene, Poly(cis-isoprene), which is natural rubber, Poly(2-hydroxypropyl acrylate), Poly(isobutylacrylate), or Poly(isobutylmethacrylate).

The addition of elastomer material 116 can provide additional elasticity to the bending beams 114, particularly as the substrate that comprises the bending beams 114 loses flexibility over time. The elastomer material 116 flexibly supports the bending beams 114 as the substrate assembly 12 is inserted into the receptacle 14, further facilitating a fit of uniform pressure between the exposed traces 32 and 40.

Figure 17:
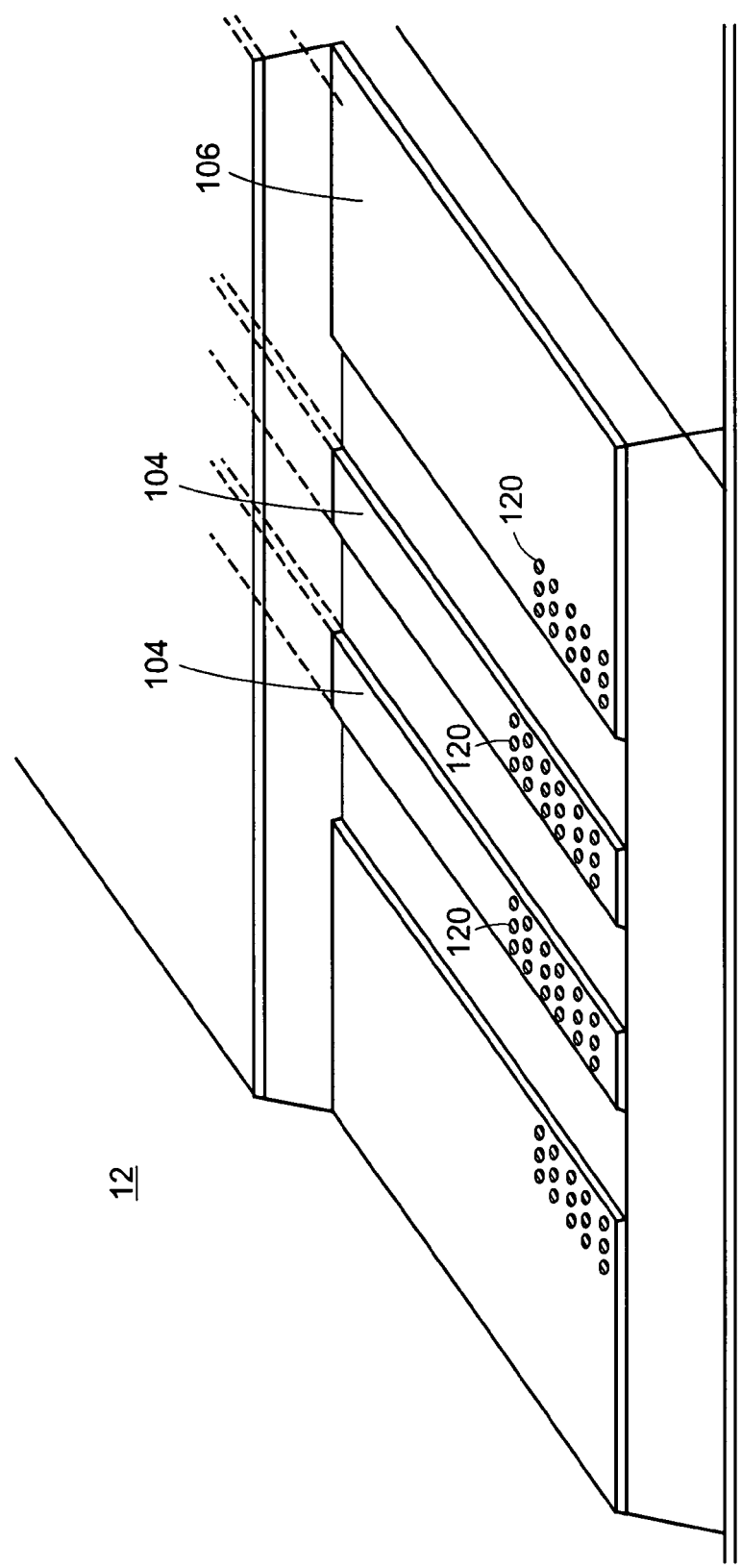
FIG. 17 is a perspective view of the substrate assembly wherein protrusions are disposed upon the signal traces.

In FIG. 17, there is shown another mechanism for improving the quality of the direct electrical interconnection. Traces 104 and 106 on a substrate assembly 12 are shown to have protrusions 120 disposed thereon, which may be for example welded gold ball contacts. These small protrusions 120 facilitate establishment of the direct electrical interconnection by deforming slightly against the corresponding trace when the substrate assembly 12 is inserted into the receptacle 14. Nickel and gold protrusions, for example, may be formed on copper traces by pre-cleaning the copper surface, applying at least 0.120" of electroless nickel on the copper, and then applying approximately 0.030" electroless gold on the nickel surface. Embodiments of protrusions are described in U.S. Pat. No. 5,101,553, entitled "Method of making a metal-on-elastomer pressure contact connector," which is incorporated by reference. The protrusions 120 may be disposed upon the traces 104 and 106 on the substrate assembly 12, or on the corresponding traces on the receptacle 14, or on both sets of traces.

Figure 18:
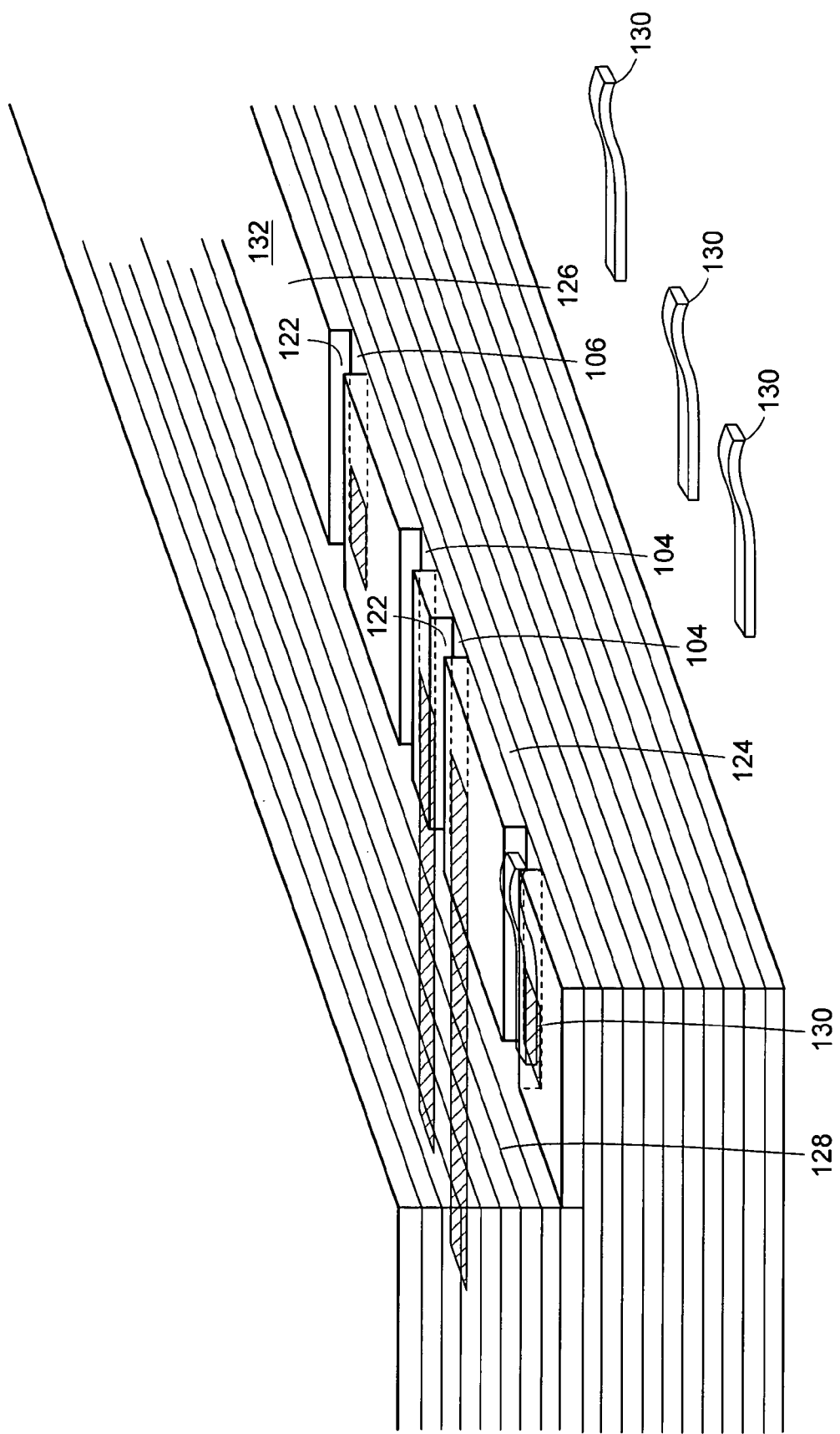
FIG. 18 is a perspective view of another aspect of the invention wherein the signal traces are disposed within channels on the substrate.

In FIG. 18, there is shown another mechanism for improving the quality of the direct electrical interconnection. As shown herein, the high frequency signal traces 104 and 106 reside within channels 122. The signal traces 104 and 106 reside on an exposed substrate layer 124, while material has been removed from the substrate layer 126 above the layer 124 such that channels 122 are formed and such that the signal traces 104 and 106 reside on the floors of the channels. The upper substrate layers 128 have been removed above the channels 122 such that the signal traces 104 and 106 within the channels 122 are exposed for direct electrical interconnection with corresponding signal traces on a receptacle 14. The channels 122 may be formed such that the channels are the same width as the signal traces 104 and 106, or are wider than the signal traces 104 and 106. The walls of the channels may be perpendicular to the plane of the substrate layer 124 or may be disposed at an angle, and may be straight or curved.

Also shown are resilient conductive members 130, herein embodied as leaf springs. The resilient conductive members 130 are bonded to the exposed signal traces 104 and 106, for example by soldering or welding. The resilient conductive members 130 may initially be part of a busbar assembly. The busbar assembly is aligned with the subtstrate assembly 12 such that the resilient conductive members 130 are aligned with the signal traces 104 and 106. The resilient conductive members 130 are then welded or soldered to the traces 104 and 106, preferably in a single operation, and then the busbar is cut off, leaving an individual resilient conductive member 130 on each trace 104 and 106. Alternatively, individual resilient contact members 130 can be placed on each trace 104 and 106, for example by hand or by pick-and-place machine.

Once attached to the signal traces 104 and 106, the resilient conductors 130 protrude slightly above the top surface 132 of the layer 126, for example by about 5 mils. When the substrate assembly 12 is inserted into the receptacle 14, the resilient conductive members 130 will resiliently contact exposed signal traces on the receptacle 14 to form the direct electrical interconnection. The resiliency of the conductive members provides reliable electrical interconnections between each corresponding signal trace despite any warping or deformations that may exist in the substrate assembly 12 or the receptacle 14.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breadth and spirit of the present invention as disclosed herein.

What is claimed is:

1. A connector assembly comprising:
 a substrate assembly including
 a receptacle;
 a first substrate layer including a conductive trace, the conductive trace being accessible for direct electrical interconnection with a first conductor associated with the receptacle;
 a second substrate layer including an electrical contact for electrical interconnection with a second conductor associated with said receptacle; and
 a conductive contacting member, such that when the substrate assembly is inserted into the receptacle, the electrical contact is electrically connected with the second conductor via the contacting member, and the contacting member serves to maintain a direct electrical interconnection between the conductive trace and the first conductor.

2. The connector assembly of claim 1 wherein the conductive trace is for transmitting a high frequency signal and the electrical contact is for transmitting a lower frequency signal.

3. The connector assembly of claim 1 wherein the conductive contacting member is located on the receptacle.

4. The connector assembly of claim 1 wherein the conductive contacting member is located on the substrate assembly.

5. The connector assembly of claim 1 wherein the conductive contacting member is a leaf spring.

* * * * *